(12) United States Patent
Yang

(10) Patent No.: US 11,322,558 B2
(45) Date of Patent: May 3, 2022

(54) DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventor: Hanning Yang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 272 days.

(21) Appl. No.: 16/495,199

(22) PCT Filed: May 29, 2019

(86) PCT No.: PCT/CN2019/088983
§ 371 (c)(1),
(2) Date: Sep. 18, 2019

(87) PCT Pub. No.: WO2020/206825
PCT Pub. Date: Oct. 15, 2020

(65) Prior Publication Data
US 2021/0335945 A1    Oct. 28, 2021

(30) Foreign Application Priority Data
Apr. 11, 2019  (CN) .......................... 201910287310.9

(51) Int. Cl.
*H01L 27/32* (2006.01)
*H01L 27/15* (2006.01)
(Continued)

(52) U.S. Cl.
CPC .......... *H01L 27/323* (2013.01); *H01L 27/156* (2013.01); *H01L 27/3246* (2013.01);
(Continued)

(58) Field of Classification Search
CPC .... G06K 9/00; G06K 9/00013; G06K 9/0004; G06K 9/00046; G06K 19/0718;
(Continued)

(56) References Cited

U.S. PATENT DOCUMENTS

2008/0011937 A1   1/2008 Toshikiyo
2012/0321149 A1*  12/2012 Carver ............... G06K 9/0012
                                              382/124
(Continued)

FOREIGN PATENT DOCUMENTS

CN   101098415 A   1/2008
CN   103728544 A   4/2014
(Continued)

*Primary Examiner* — Eduardo A Rodela

(57) ABSTRACT

A display panel and an electronic device. The display panel includes a substrate; a thin film transistor layer, the thin film transistor layer is located on the substrate; a light emitting layer, the light emitting layer is located on the thin film transistor layer, the light emitting layer includes a plurality of pixel points; the light emitting layer further includes a plurality of concentrating units, each of the concentrating units being located between two adjacent pixel points, and spaced apart from the pixel points.

18 Claims, 2 Drawing Sheets

(51) Int. Cl.
*H01L 31/12* (2006.01)
*H01L 27/146* (2006.01)

(52) U.S. Cl.
CPC ........ *H01L 27/3258* (2013.01); *H01L 31/125* (2013.01); *H01L 27/14678* (2013.01); *H01L 27/3234* (2013.01)

(58) Field of Classification Search
CPC ............... H01L 27/3227; H01L 27/323; H01L 27/3258; H01L 27/156; H01L 27/3246; H01L 27/14678; H01L 27/3234; H01L 31/0543; H01L 31/0547; H01L 31/12; H01L 31/125; H01L 31/14; H01L 31/147; H01L 31/153

See application file for complete search history.

(56) References Cited

U.S. PATENT DOCUMENTS

| | | | |
|---|---|---|---|
| 2016/0276417 A1* | 9/2016 | Huang | H01L 27/3246 |
| 2017/0161540 A1* | 6/2017 | Mienko | G06K 9/00073 |
| 2017/0316248 A1* | 11/2017 | He | G06K 9/00013 |
| 2018/0239189 A1 | 8/2018 | Koito | |
| 2018/0276444 A1 | 9/2018 | Sun et al. | |
| 2019/0026530 A1 | 1/2019 | Wu et al. | |
| 2020/0105970 A1* | 4/2020 | Ahmed | H01L 33/44 |
| 2021/0019017 A1* | 1/2021 | Yeke Yazdandoost | H01L 51/5296 |

FOREIGN PATENT DOCUMENTS

| | | |
|---|---|---|
| CN | 106022324 A | 10/2016 |
| CN | 106847872 A | 6/2017 |
| CN | 107368822 A | 11/2017 |
| CN | 109190599 A | 1/2019 |
| CN | 109472236 A | 3/2019 |
| CN | 208654805 U | 3/2019 |

\* cited by examiner

DISPLAY PANEL AND ELECTRONIC DEVICE

BACKGROUND OF INVENTION

Cross Reference to Related Application

This application claims the priority of International Application No. PCT/CN2019/088983, filed on 2019 May 29, which claims priority to Chinese Application No, 201910287310.9, filed on 2019 Apr. 11. The entire disclosures of each of the above applications are incorporated herein by reference.

Field of Invention

The present invention relates to the field of display technologies, and in particular, to a display panel and electronic device.

Description of Prior Art

With the development of display technology, in order to get a smart device with a high screen ratio, optical components such as fingerprint recognition device or camera should be integrated in a display panel or disposed under the display panel.

Taking the fingerprint recognition device as an example, in order to acquire a fingerprint image, light should be emitted from pixel points of the display panel and irradiated onto the finger through the display panel. Then light reflected by the finger is received by the fingerprint recognition device located below the display screen to generate an image. In this process, each functional film layer of the display panel absorbs and reflects light, thereby the reflected light is greatly depleted and fails to reach an intensity required for recognition.

Technical Problem

In the prior art, light emitted by the pixel points above the fingerprint recognition should has a high intensity (above 600 nits) to realize a function of under-screen fingerprint recognition. However, the pixel points of the region emitting high-intensity emitted light are more prone to age than other regions, which will affect the display effect of the display panel and reduce the service life of the display panel.

SUMMARY OF INVENTION

The present invention provides a display panel and an electronic device to enhance the intensity of the reflected light received by the light recognition unit and prevent the device from aging.

In order to solve the above problems, the present invention provides a display panel, wherein the display panel comprises:

a substrate;

a thin film transistor layer disposed on the substrate;

a light emitting layer disposed on the thin film transistor layer, the light emitting layer comprising a plurality of pixel points;

a concentrating structure comprising a plurality of concentrating units, each of the concentrating units spaced apart from the pixel points;

wherein the thin film transistor layer comprises a planarization layer, and the concentrating structure is located in the planarization layer.

According to one aspect of the invention, wherein the concentrating units are transparent film with a graded refractive index.

According to one aspect of the invention, wherein a refractive index of the concentrating unit gradually increases from a periphery of the concentrating unit to a center of the concentrating unit, and a refractive index of a geometric center of the concentrating unit is maximum.

According to one aspect of the invention, wherein the light emitting layer comprises a functional region, the functional region comprises a plurality of pixel points at least partially adjacent to each other, the concentrating units are disposed between any two of the pixel points of the functional region.

According to one aspect of the invention, wherein the light emitting layer comprises a non-functional region, the non-functional region is provided with a pixel defining layer, and the concentrating structure is disposed in the pixel defining layer.

According to one aspect of the invention, wherein a height of the concentrating unit is equal to a height of the pixel defining layer.

According to one aspect of the invention, wherein the planarization layer is provided with a plurality of metal escaping regions, and the concentrating units are located in the metal escaping region.

According to one aspect of the invention, wherein a height of the concentrating unit is equal to a height of the metal escaping region.

The present invention further provides a display panel, wherein the display panel comprises:

a substrate;

a thin film transistor layer disposed on the substrate;

a light emitting layer disposed on the thin film transistor layer, the light emitting layer comprising a plurality of pixel points;

a concentrating structure comprising a plurality of concentrating units, each of the concentrating units spaced apart from the pixel points.

According to one aspect of the invention, wherein the concentrating units are transparent film with a graded refractive index.

According to one aspect of the invention, wherein a refractive index of the concentrating unit gradually increases from a periphery of the concentrating unit to a center of the concentrating unit, and a refractive index of a geometric center of the concentrating unit is maximum.

According to one aspect of the invention, wherein the light emitting layer comprises a functional region, the functional region comprises a plurality of pixel points at least partially adjacent to each other, the concentrating units are disposed between any two of the pixel points of the functional region.

According to one aspect of the invention, wherein the light emitting layer comprises a non-functional region, the non-functional region is provided with a pixel defining layer, and the concentrating structure is disposed in the pixel defining layer.

According to one aspect of the invention, wherein a height of the concentrating unit is equal to a height of the pixel defining layer.

According to one aspect of the invention, wherein the thin film transistor layer comprises a planarization layer, and the concentrating structure is located in the planarization layer.

According to one aspect of the invention, wherein the planarization layer is provided with a plurality of metal escaping regions, and the concentrating units are located in the metal escaping region.

According to one aspect of the invention, wherein a height of the concentrating unit is equal to a height of the metal escaping region.

The present invention further provides an electronic device, wherein the electronic device comprises a display panel, the display panel comprising:

a substrate;

a thin film transistor layer disposed on the substrate;

a light emitting layer located on the thin film transistor layer and the light emitting layer comprising a plurality of pixel points;

a concentrating structure comprising a plurality of concentrating units, and each of the concentrating units is spaced apart from the pixel points.

According to one aspect of the invention, wherein the electronic device further comprises a light identifying unit located on a side of the substrate away from the light emitting layer.

Beneficial Effects

The invention provides concentrating units between the pixel points of the light emitting layer, and the concentrating units are transparent film layer with a gradual refractive index, which can collect light reflected by finger and entering the screen, thereby collect more fingerprint information under weak light intensity and project them onto the corresponding optical sensor. The invention can realize data collection without the pixel points of the fingerprint recognition region emitting high-intensity light, thereby effectively improving the service life of the display panel.

DETAILED DESCRIPTION OF PREFERRED EMBODIMENTS

Figure 1:
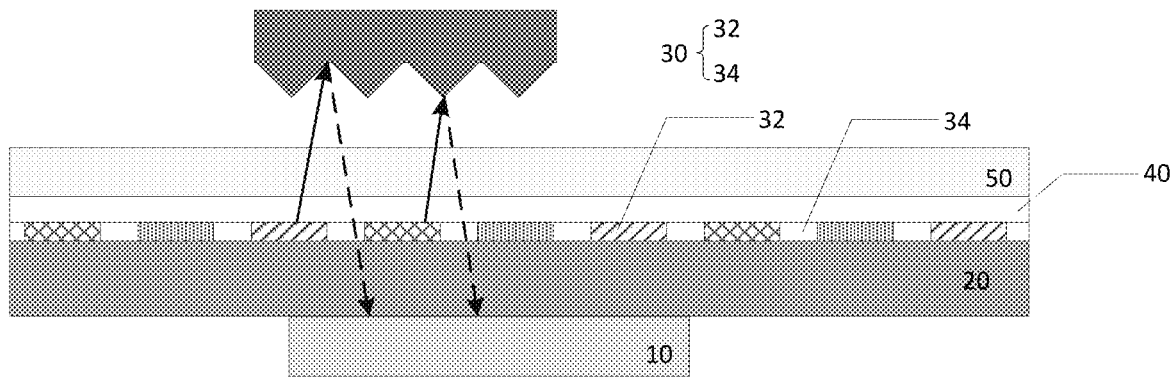
FIG. 1 is a cross-sectional view of a display panel in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described. Referring to FIG. 1, FIG. 1 is a schematic structural diagram of a display panel in the prior art. The display panel includes a substrate 20, a light emitting layer 30, an encapsulation layer 40, and a cover plate 50.

The substrate 20 includes a thin film transistor layer for controlling display. The light emitting layer 30 includes a plurality of pixel points 32 and isolation units 34 located between the plurality of pixel points 32. In this embodiment, the isolation units are parts of a pixel definition layer.

A light recognition unit 10 is disposed below the display panel. Generally, the light recognition unit 10 is a finger recognition unit for identifying a corresponding fingerprint image according to a reflected light entering the display panel.

In order to acquire a fingerprint image, light should be emitted from pixel points 32 of the display panel and irradiated onto the finger through the display panel. Then light reflected by the finger is received by the fingerprint recognition device located below the display screen to generate an image. In this process, each functional film layer of the display panel absorbs and reflects light, thereby the reflected light is greatly depleted and failing to reach an intensity required for recognition. In the prior art, light emitted by the pixel points above the fingerprint recognition should has a high intensity (above 600 nits) to realize a function of under-screen fingerprint recognition.

However, the pixel points of the region emitting high-intensity emitted light are more prone to age than other regions, which will affect the display effect of the display panel and reduce the service life of the display panel.

Figure 2:
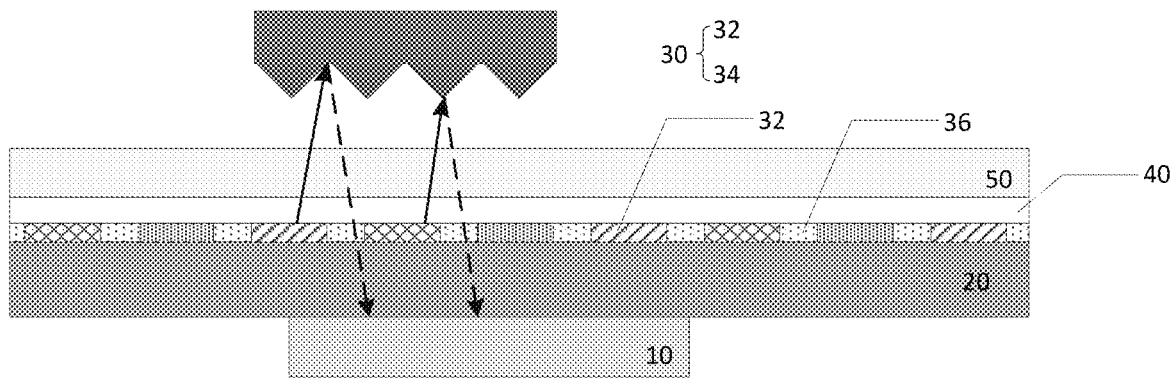
FIG. 2 is a cross-sectional view of a display panel in a first embodiment of the present invention.
Figure 3:
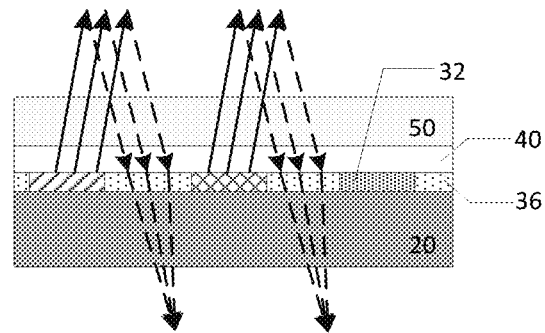
FIG. 3 is a partial cross-sectional view of a display panel in the first embodiment of the present invention.
Figure 4:
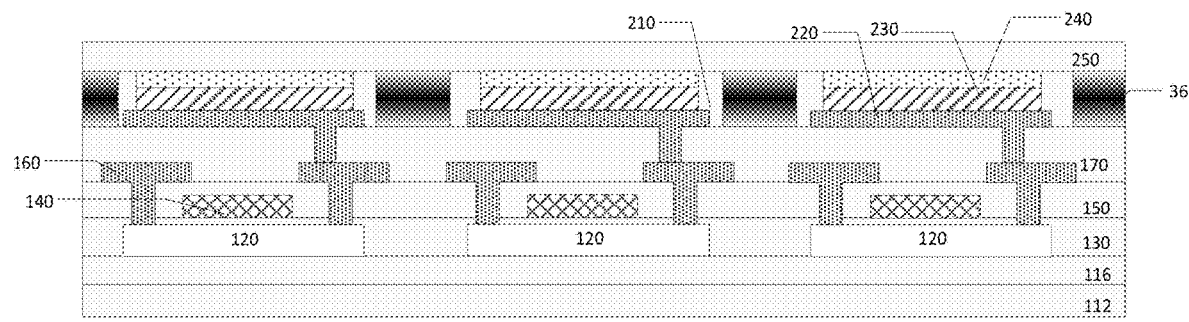
FIG. 4 is an enlarged structural view of a display panel in the first embodiment of the present invention.

To solve the above problems, the present invention provides a display panel and an electronic device to enhance the intensity of the reflected light received by the light recognition unit and prevent the device from aging. Referring to FIG. 2, FIG. 3, and FIG. 4, FIG. 2 is a cross-sectional view of a display panel in a first embodiment of the present invention, FIG. 3 is a partial cross-sectional view of a display panel in the first embodiment of the present invention, FIG. 4 is an enlarged structural view of a display panel in the first embodiment of the present invention.

The present invention provides a display panel comprising a substrate 20, a light emitting layer 30, an encapsulation layer 40, and a covering plate 50.

The substrate 20 includes a thin film transistor layer. The thin film transistor layer includes a plurality of thin film transistors corresponding to light emitting structures in the light emitting layer.

The light emitting layer 30 is located on the thin film transistor layer, and the light emitting layer 30 includes a plurality of pixel points 32.

Referring to FIG. 4, a structure of the thin film transistor layer and the light emitting layer 30 is shown. The thin film transistor layer includes a substrate 112, a buffer layer 116, an active region 120, a gate dielectric layer 130, a gate metal layer 140, an interlayer dielectric layer 150, a source/drain metal layer 160, and a planarization layer 170. The light emitting layer includes a pixel defining layer 210, an anode 220, a light emitting material 230, and a cathode 240, and a thin film encapsulating layer 250 covering the light emitting structure 30.

Compared with the prior art, the present invention also includes a concentrating structure, the concentrating structure includes a plurality of concentrating units 36, each of the concentrating units 36 is located between two adjacent pixel points and spaced apart from the pixel points 32.

Referring to FIG. 2, the light emitting layer 30 includes a non-functional region, and the non-functional region is provided with a pixel defining layer, and the concentrating structure is located in the pixel defining layer. The pixel definition layer defines a plurality of pixel points 32, and the plurality of concentrating units 36 are located between any two of the plurality of pixel points 32 of the non-functional region. The concentrating units 36 are capable of concentrating light entering the display panel, reducing light loss and enhancing light intensity.

The concentrating units 36 are a transparent film with a graded refractive index. In this embodiment, the concentrating units 36 can be microlens or other transparent material. Preferably, the refractive index of the concentrating units 36 gradually increases from a periphery of the concentrating units 36 to a center of the concentrating units 36, and a refractive index of a geometric center of the concentrating unit is maximum. The concentrating units 36 adjacent to the pixel points of different colors have a same change in refractive index or have different changes in refractive index. The graded index layer constituting the concentrating units 36 can be obtained by diffusing a high refractive index organic or inorganic material in the original pixel defining layer, and the change in refractive index can be controlled by diffusion time.

Sensitivity of a detector is directly related to a light collection capability of the microlens. The concentrating units 36 in the present invention are capable of concentrating light, when the pixel points 32 emit light with weak intensity, the reflected light is concentrated by the microlens and can be effectively received by the detector, thereby improving the detection sensitivity of the fingerprint.

Referring to FIG. 3 and FIG. 4, the concentrating units 36 are located in the pixel defining layer 210 between two adjacent pixel points 32, and a height of the concentrating units 36 are equal to a height of the pixel defining layer 210. In this embodiment, the thin film transistor layer has a plurality of metal escaping regions, and the positions of the plurality of metal escaping regions are in one-to-one correspondence with the positions of the plurality of concentrating units 36.

Figure 5:
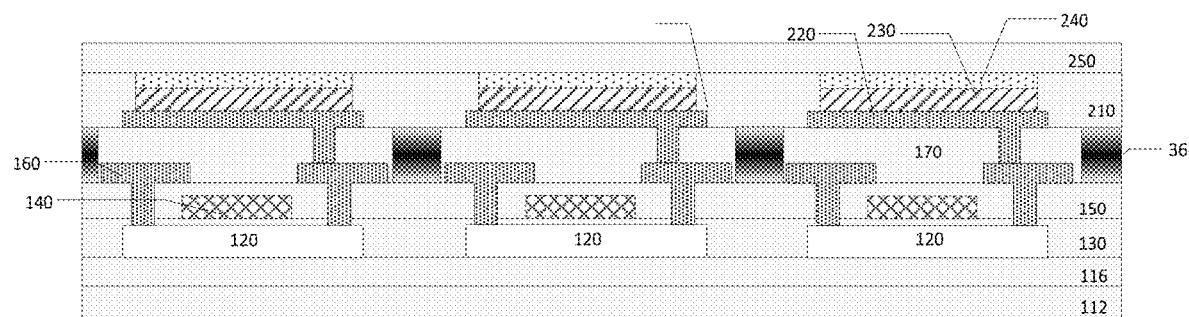
FIG. 5 is an enlarged structural view of a display panel in a second embodiment of the present invention.
Figure 6:
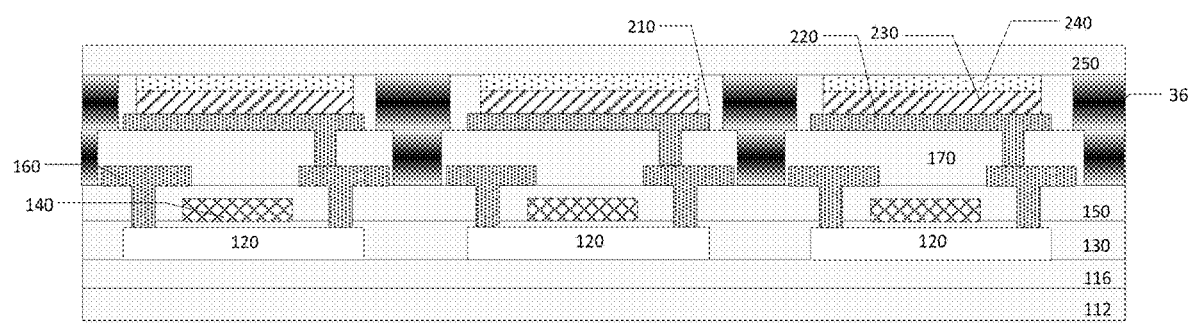
FIG. 6 is an enlarged structural view of a display panel in a third embodiment of the present invention.

Referring to FIG. 5 and FIG. 6, in other embodiments of the present invention, a planarization layer of the thin film transistor layer is provided with a plurality of metal escaping regions, and the concentrating units 36 are located in the metal escaping regions. As shown in FIG. 5, the concentrating units 36 are located in the planarization layer 170 of the thin film transistor layer. As shown in FIG. 6, the concentrating units 36 are located in the planarization layer 170 of the thin film transistor layer and the pixel defining layer 210 of the light emitting layer. A height of the concentrating units 36 is less than or equal to a height of the metal escaping regions.

Correspondingly, the present invention further provides an electronic device comprising a display panel and a light identifying unit on a side of the substrate away from the light emitting layer, the light identifying unit is located under a portion of the concentrating units 36.

The present invention provides a display panel comprising: a substrate 20, a light emitting layer 30, an encapsulation layer 40, and a covering plate 50.

The substrate 20 includes a thin film transistor layer. The thin film transistor layer includes a plurality of thin film transistors corresponding to light emitting structures in the light emitting layer.

The light emitting layer 30 is located on the thin film transistor layer, and the light emitting layer 30 includes a plurality of pixel points 32.

Referring to FIG. 4, a structure of the thin film transistor layer and the light emitting layer 30 is shown. The thin film transistor layer includes a substrate 112, a buffer layer 116, an active region 120, a gate dielectric layer 130, a gate metal layer 140, an interlayer dielectric layer 150, a source/drain metal layer 160, and a planarization layer 170. The light emitting layer includes a pixel defining layer 210, an anode 220, a light emitting material 230, and a cathode 240, and a thin film encapsulating layer 250 covering the light emitting structure 30.

Compared with the prior art, the present invention also includes a concentrating structure, the concentrating structure includes a plurality of concentrating units 36, each of the concentrating units 36 is located between two adjacent pixel points and spaced apart from the pixel points 32.

Referring to FIG. 2, the light emitting layer 30 includes a non-functional region, and the non-functional region is provided with a pixel defining layer, and the concentrating structure is located in the pixel defining layer. The pixel definition layer defines a plurality of pixel points 32, and the plurality of concentrating units 36 are located between any two of the plurality of pixel points 32 of the non-functional region. The concentrating units 36 are capable of concentrating light entering the display panel, reducing light loss and enhancing light intensity.

The concentrating units 36 are a transparent film with a graded refractive index. In this embodiment, the concentrating units 36 can be microlens or other transparent material. Preferably, the refractive index of the concentrating units 36 gradually increases from a periphery of the concentrating units 36 to a center of the concentrating units 36, and a refractive index of a geometric center of the concentrating unit is maximum. The concentrating units 36 adjacent to the pixel points of different colors have a same change in refractive index or have different changes in refractive index. The graded index layer constituting the concentrating units 36 can be obtained by diffusing a high refractive index organic or inorganic material in the original pixel defining layer, and the change in refractive index can be controlled by diffusion time.

Sensitivity of a detector is directly related to a light collection capability of the microlens. The concentrating units 36 in the present invention are capable of concentrating light, when the pixel points 32 emit light with weak intensity, the reflected light is concentrated by the microlens and can be effectively received by the detector, thereby improving the detection sensitivity of the fingerprint.

Referring to FIG. 3 and FIG. 4, the concentrating units 36 are located in the pixel defining layer 210 between two adjacent pixel points 32, and a height of the concentrating units 36 are equal to a height of the pixel defining layer 210. In this embodiment, the thin film transistor layer has a plurality of metal escaping regions, and the positions of the plurality of metal escaping regions are in one-to-one correspondence with the positions of the plurality of concentrating units 36.

Referring to FIG. 5 and FIG. 6, in other embodiments of the present invention, a planarization layer of the thin film transistor layer is provided with a plurality of metal escaping regions, and the concentrating units 36 are located in the metal escaping regions. As shown in FIG. 5, the concentrating units 36 are located in the planarization layer 170 of the thin film transistor layer. As shown in FIG. 6, the concentrating units 36 are located in the planarization layer 170 of the thin film transistor layer and the pixel defining layer 210 of the light emitting layer. A height of the concentrating units 36 is less than or equal to a height of the metal escaping regions.

The invention provides concentrating units between the pixel points of the light emitting layer, and the concentrating units are transparent film layer with a gradual refractive index, which can collect light reflected by finger and entering the screen, thereby collect more fingerprint information under weak light intensity and project them onto the corresponding optical sensor. The invention can realize data collection without the pixel points of the fingerprint recognition region emitting high-intensity light, thereby effectively improving the service life of the display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel, wherein the display panel comprises:
a substrate;
a thin film transistor layer disposed on the substrate;
a light emitting layer disposed on the thin film transistor layer, the light emitting layer comprising a plurality of pixel points;
a concentrating structure comprising a plurality of concentrating units, each of the concentrating units spaced apart from the pixel points;
wherein the thin film transistor layer comprises a planarization layer, and the concentrating structure is located in the planarization layer.

2. The display panel according to claim 1, wherein the concentrating units are transparent film with a graded refractive index.

3. The display panel according to claim 2, wherein the light emitting layer comprises a non-functional region, the non-functional region is provided with a pixel defining layer, and the concentrating structure is disposed in the pixel defining layer.

4. The display panel according to claim 3, wherein a height of the concentrating unit is equal to a height of the pixel defining layer.

5. The display panel according to claim 1, wherein a refractive index of the concentrating unit gradually increases from a periphery of the concentrating unit to a center of the concentrating unit, and a refractive index of a geometric center of the concentrating unit is maximum.

6. The display panel according to claim 1, wherein the light emitting layer comprises a functional region, the functional region comprises a plurality of pixel points at least partially adjacent to each other, the concentrating units are disposed between any two of the pixel points of the functional region.

7. The display panel according to claim 1, wherein the planarization layer is provided with a plurality of metal escaping regions, and the concentrating units are located in the metal escaping region.

8. The display panel of claim 7, wherein a height of the concentrating unit is equal to a height of the metal escaping region.

9. A display panel, wherein the display panel comprises:
a substrate;
a thin film transistor layer disposed on the substrate;
a light emitting layer disposed on the thin film transistor layer, the light emitting layer comprising a plurality of pixel points;
a concentrating structure comprising a plurality of concentrating units, each of the concentrating units spaced apart from the pixel points; and
wherein the concentrating units are transparent film with a graded refractive index.

10. The display panel according to claim 9, wherein a refractive index of the concentrating unit gradually increases from a periphery of the concentrating unit to a center of the concentrating unit, and a refractive index of a geometric center of the concentrating unit is maximum.

11. The display panel according to claim 9, wherein the light emitting layer comprises a functional region, the functional region comprises a plurality of pixel points at least partially adjacent to each other, the concentrating units are disposed between any two of the pixel points of the functional region.

12. The display panel according to claim 9, wherein the light emitting layer comprises a non-functional region, the non-functional region is provided with a pixel defining layer, and the concentrating structure is disposed in the pixel defining layer.

13. The display panel according to claim 12, wherein a height of the concentrating unit is equal to a height of the pixel defining layer.

14. The display panel according to claim 9, wherein the thin film transistor layer comprises a planarization layer, and the concentrating structure is located in the planarization layer.

15. The display panel according to claim 14, wherein the planarization layer is provided with a plurality of metal escaping regions, and the concentrating units are located in the metal escaping region.

16. The display panel according to claim 15, wherein a height of the concentrating unit is equal to a height of the metal escaping region.

17. An electronic device, wherein the electronic device comprises a display panel, the display panel comprising:
a substrate;
a thin film transistor layer disposed on the substrate;
a light emitting layer located on the thin film transistor layer and the light emitting layer comprising a plurality of pixel points;
a concentrating structure comprising a plurality of concentrating units, and each of the concentrating units is spaced apart from the pixel points; and
wherein the concentrating units are transparent film with a graded refractive index.

18. The electronic device according to claim 17, wherein the electronic device further comprises a light identifying unit located on a side of the substrate away from the light emitting layer.

* * * * *